(12) United States Patent
Yang et al.

(10) Patent No.: US 9,853,078 B2
(45) Date of Patent: Dec. 26, 2017

(54) WAFER LEVEL CURVED IMAGE SENSORS AND METHOD OF FABRICATING THE SAME

(71) Applicant: SK hynix Inc., Gyeonggi-do (KR)

(72) Inventors: Yun-Hui Yang, Gyeonggi-do (KR); Sung-Bo Hwang, Gyeonggi-do (KR); Young-Hun Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/280,657

(22) Filed: Sep. 29, 2016

(65) Prior Publication Data

US 2017/0345861 A1 Nov. 30, 2017

(30) Foreign Application Priority Data

May 31, 2016 (KR) .................. 10-2016-0067056

(51) Int. Cl.
*H01L 21/3105* (2006.01)
*H01L 27/146* (2006.01)

(52) U.S. Cl.
CPC .. *H01L 27/14632* (2013.01); *H01L 21/31056* (2013.01); *H01L 27/1462* (2013.01); *H01L 27/14618* (2013.01); *H01L 27/14636* (2013.01); *H01L 27/14625* (2013.01); *H01L 27/14627* (2013.01)

(58) Field of Classification Search
CPC ......... H01L 27/14607; H01L 27/14634; H01L 27/14636; H01L 27/14687; H01L 27/1469; H01L 27/31065
See application file for complete search history.

(56) References Cited

U.S. PATENT DOCUMENTS

2012/0147207 A1* 6/2012 Itonaga ............ H01L 27/14618
348/222.1
2012/0299140 A1 11/2012 Sekine

FOREIGN PATENT DOCUMENTS

KR 100851755 8/2008
KR 1020170118435 10/2017

\* cited by examiner

*Primary Examiner* — Kyoung Lee
*Assistant Examiner* — Christina Sylvia
(74) *Attorney, Agent, or Firm* — IP & T Group LLP

(57) ABSTRACT

A wafer level curved image sensor may include a substrate having a central region, a peripheral region, and an edge region, the peripheral region being formed between the central region and the edge region, supporting patterns formed over the substrate, first fixed patterns formed between the supporting patterns, and an image sensing chip formed over the supporting patterns. The supporting patterns and the first fixed patterns, in combination, form a planar lower surface and a concavely-curved upper surface. The image sensing chip has a curved lower surface and a curved upper surface.

19 Claims, 15 Drawing Sheets

WAFER LEVEL CURVED IMAGE SENSORS AND METHOD OF FABRICATING THE SAME

CROSS-REFERENCE TO RELATED APPLICATIONS

The present application claims priority under 35 U.S.C 119(a) to Korean Patent Application No. 10-2016-0067056, filed on May 31, 2016, which is incorporated herein by reference in its entirety.

BACKGROUND

1. Field

Various embodiments of the inventive concepts relate to a semiconductor device fabrication technology and, more particularly, to wafer level curved image sensors and an electronic device including the same.

2. Description of the Related Art

In an image system such as an image sensor module, a spherical camera lens is disposed on a light-receiving side of an image sensor. Due to spherical aberration of a camera lens, pixels of an image sensor have different light-receiving amounts depending on locations. For example, pixels of a central part and outer pixels may have different photoelectric conversion capability depending on different focus points and/or different light-receiving amounts. To improve this, an image sensor with a concavely curved upper surface is proposed so that the concavely curved upper surface can compensate for a curved surface of the camera lens.

SUMMARY

Various embodiments of the inventive concepts provide wafer level curved image sensors.

Various embodiments of the inventive concepts provide methods for fabricating the wafer level curved image sensors.

An embodiment of the inventive concepts provides an electronic device including the wafer level curved image sensors.

The technical objectives and embodiments of the inventive concepts are not limited to the above disclosure; other objectives and embodiments may become apparent to those of ordinary skill in the art based on the following descriptions.

In accordance with an embodiment of the inventive concepts, a wafer level curved image sensor may include supporting patterns formed over a substrate, first fixed patterns formed between the supporting patterns, and an image sensing chip formed over the supporting patterns. The supporting patterns and the first fixed patterns, in combination, form a planar lower surface and a concavely-curved upper surface. The image sensing chip has a curved lower surface and a curved upper surface.

The substrate may include a central region, an edge region, and a peripheral pattern formed between the central region and the edge region. The wafer level curved image sensor may further include peripheral fixed patterns formed in the peripheral region and extending through the image sensing chip and the supporting patterns to contact the substrate.

The central region, the peripheral region, and the edge region may be disposed in a chip area of the image sensing chip.

The wafer level curved image sensor may further include second fixed patterns formed in the central region and the peripheral region, covering the upper surfaces of the supporting patterns and upper surfaces of the first fixed patterns, and contacting the planar lower surface of the image sensing chip.

The first fixed patterns and the second fixed patterns may be formed of the same material as each other and coupled to each other.

The wafer level curved image sensor may further include a buffer layer provided between the supporting patterns and the image sensing chip and between the first fixed patterns and the image sensing chip.

The buffer layer may include the same material as the supporting patterns.

A pattern density of the supporting patterns in the central region may be lower than a pattern density of the supporting patterns in the peripheral region.

A total area occupied by the first fixed patterns in the central region may be greater than a total area occupied by the supporting patterns in the peripheral region.

The first fixed patterns may be not disposed in the edge region.

The supporting patterns and the lower fixed patterns may be arranged side by side in an alternative manner.

In accordance with an embodiment of the inventive concepts, a wafer level curved image sensor may include a substrate having a planar upper surface, supporting patterns formed over the planar upper surface of the substrate, lower fixed patterns formed between the supporting patterns, an image sensing chip formed over the supporting patterns and the lower fixed patterns, and peripheral fixed patterns vertically extending through the image sensing chip and the supporting patterns to contact the planar upper surface of the substrate. The supporting patterns and the lower fixed patterns, in combination, may form a planar lower surface and a concavely-curved upper surface.

A lower surface and an upper surface of the image sensing chip may be curved along a profile of the concavely-curved upper surface formed by the supporting patterns and the lower fixed patterns.

The wafer level curved image sensor may further include a buffer layer provided between the supporting patterns and the image sensing chip and between the lower fixed patterns and the image sensing chip. A lower surface and an upper surface of the buffer layer may be curved along a profile of the concavely-curved upper surface formed by the supporting patterns and the lower fixed patterns.

The wafer level curved image sensor may further include upper fixed patterns provided between the supporting patterns and the image sensing chip and between the lower fixed patterns and the image sensing chip. Lower surfaces and upper surfaces of the upper fixed patterns may be curved along a profile of the concavely-curved upper surface formed by the supporting patterns and the lower fixed patterns.

Each of the lower fixed patterns and the peripheral fixed patterns may include an adhesive, a hardening material, or a combination thereof.

In accordance with an embodiment of the inventive concepts, a wafer level curved image sensor, may include a lower substrate having a central region, a peripheral region surrounding the central region, and an edge region surrounding the peripheral region, supporting patterns formed over the lower substrate, lower fixed patterns formed between the supporting patterns, an image sensing chip formed over the supporting patterns and the lower fixed patterns, and peripheral fixed patterns formed in the peripheral region and vertically extending through the image sensing chip and the supporting patterns to contact the lower substrate. The supporting patterns and the lower fixed patterns, in combination, may form a concavely curved upper surface in the central and peripheral regions. The image sensing chip may have a concavely curved upper surface in the central and peripheral regions. The supporting patterns, in combination, may form a planar upper surface in the edge region. The image sensing chip may have a planar upper surface in the edge region.

The supporting patterns may have island shapes. The lower fixed patterns may have web shapes.

The peripheral fixed patterns may have line shapes and extend in a vertical direction or in a horizontal direction.

The wafer level curved image sensor may further include upper fixed patterns provided between the supporting patterns and the image sensing chip and between the lower fixed patterns and the image sensing chip, and formed in the central region and in the peripheral region.

Details of the embodiments of the inventive concepts are described in the detailed description of the specification and the accompanying drawings.

DETAILED DESCRIPTION

Figure 1:
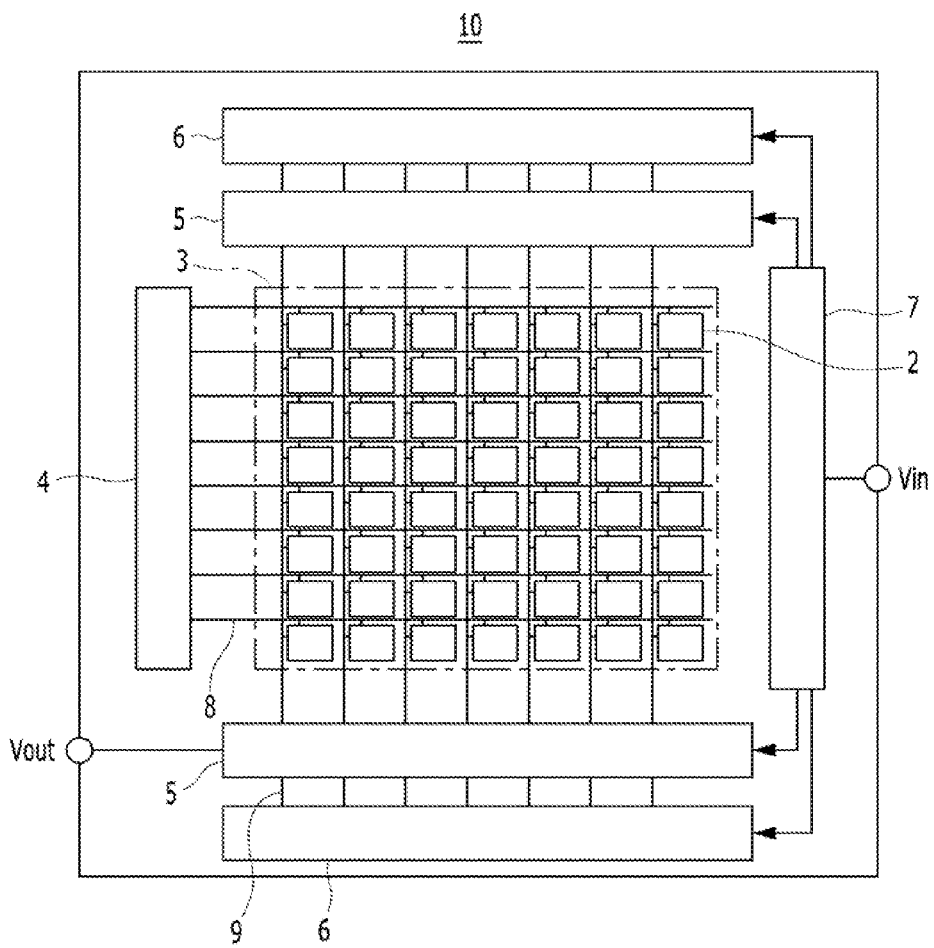
FIG. 1 is a block diagram illustrating a wafer level curved image sensor in accordance with an embodiment of the inventive concepts.

Various examples and implementations of the disclosed technology are described below in detail with reference to the accompanying drawings.

The drawings may not necessarily be to scale and in some instances, proportions of structures in the drawings may have been exaggerated to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. Throughout the disclosure, like reference numerals refer to like parts in the various figures and embodiments of the inventive concepts.

In addition, a described or illustrated example of a multi-layer structure may not reflect all layers present in that particular multilayer structure for example, one or more additional layers may be present between two illustrated layers. As a specific example, when a first layer in a described or illustrated multi-layer structure is referred to as being "on" or "over" a second layer or "on" or "over" a substrate, the first layer may be directly formed on the second layer or the substrate but may also represent a structure in which one or more other intermediate layers may exist between the first layer and the second layer or the substrate.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exist or are added.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Like numerals refer to like elements throughout the specification. Accordingly, the same numerals and similar numerals can be described with reference to other drawings, even if not specifically described in a corresponding drawing.

FIG. 1 is a block diagram illustrating a wafer level curved image sensor in accordance with an embodiment of the inventive concepts. Referring to FIG. 1, a wafer level curved image sensor 10, in accordance with an embodiment of the inventive concepts, may include a pixel array 3 in the center, a row driver 4 around the pixel array 3, column signal processors 5, column drivers 6, and a system controller 7.

The pixel array 3 may include a plurality of pixels 2 arranged in a matrix structure. The pixels 2 may include a photoelectric conversion block such as a photodiode.

The row driver 4 may select row driving lines 8 coupled to the pixel array 3 and generate a pulse for driving the pixels 2 coupled to the selected row driving line 8 to drive the pixels 2 included in the pixel array 3 on a per row unit basis. For example, the row driver 4 may sequentially select and drive the pixels 2 included in the pixel array 3 in a vertical direction.

Each of the driven pixels 2 may supply an image signal to each of the column signal processors 5 through each of column signal lines 9. The column signal processors 5 may perform a correlated double sampling process or an amplification process on the signals received from the pixels 2 or may convert the signals into digital signals.

The column drivers 6 may select columns of the column signal processors 5 and output the digital signals to an output node Vout. The column drivers 6 may buffer the digital signals, perform dark level control and row deviation correction, and process other various digital signals.

The system controller 7 may receive and/or output command signals and clock signals for operating configured elements. The wafer level curved image sensor 10 in accordance with the inventive concepts can have a concave upper surface.

Figure 2A:
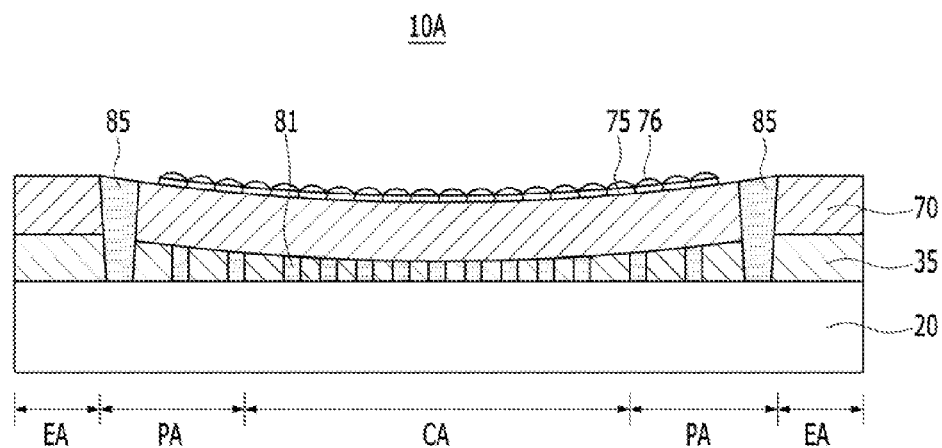
FIGS. 2A to 2F are cross-sectional views illustrating wafer level curved image sensors in accordance with various embodiments of the inventive concepts.

FIGS. 2A to 2F are schematic cross-sectional views illustrating wafer level curbed image sensors in accordance with various embodiments of the inventive concepts. Referring to FIG. 2A, a wafer level curved image sensor 10A in accordance with an embodiment of the inventive concepts, may include a lower substrate 20, supporting patterns 35 on the lower substrate 20, lower fixed patterns 81 between the supporting patterns 35, an image sensing chip 70 on the supporting patterns 35 and the lower fixed patterns 81, and peripheral fixed patterns 85.

Each upper surface of the supporting patterns 35, upper surfaces of lower fixed patterns 81, and a lower surface and an upper surface of the image sensing chip 70 may have a concave shape in a central region CA and a peripheral region PA.

The upper surfaces of the supporting patterns 35 and the lower surface and upper surface of the image sensing chip 70 may have a planar surface in an edge region EA. The image sensing chip 70 may include color filters 75 and micro-lenses 76 disposed on a concave upper surface in the central region CA and/or the peripheral region PA. The central region CA may be an internal region where the lower fixed patterns 81 have macroscopically concave upper surfaces. The peripheral region PA may be an external region, where the lower fixed patterns 81 have macroscopically concave upper surfaces, and surround the central region CA. The edge region EA may be a region, where the lower fixed patterns 81 are not formed, and may surround the central region CA. The central region CA, the peripheral region PA and the edge region EA may be formed in a chip area, rather than a scribe lane.

The lower substrate 20 may include a silicon wafer or a wafer having an epitaxially grown single crystalline silicon layer. For example, the lower substrate 20 may be a silicon substrate. The lower substrate 20 may have a planar upper surface. In some embodiments of the inventive concepts, the lower substrate 20 may include an image signal processing circuit or logic circuits. The image signal processing circuit or logic circuits of the lower substrate 20 may be electrically connected to a metal image sensing chip through a bonding wire, a through-silicon via (TSV), or a metal bonding pad.

The supporting patterns 35 may be directly formed on the lower substrate 20. The supporting patterns 35 may have planar lower surfaces and macroscopically concavely curved upper surfaces. The supporting patterns 35 may have a pillar shape or a narrow wall shape in the central region CA. The total area of the supporting patterns 35 in the central region CA may be smaller than the total area of the supporting patterns 35 in the peripheral region PA. For example, the density of the supporting patterns 35 in the central region CA may be lower than the density of the supporting patterns 35 in the peripheral region PA. The supporting patterns 35 may have a wide wall shape or a mesa shape in the edge region EA. The supporting patterns 35 may include silicon oxide, silicon nitride, silicon oxynitride, or other insulation materials.

The lower fixed patterns 81 may be disposed between an upper surface of the lower substrate 20 and a lower surface of the image sensing chip 70 and directly contact the upper surface of the lower substrate 20 and the lower surface of the image sensing chip 70 in the central region CA and the peripheral region PA. The lower fixed patterns 81 may be disposed between sidewalls of the supporting patterns 35 and contact the supporting patterns 35 in the central region CA and the peripheral region PA.

The lower fixed patterns 81 may have planar lower surfaces and macroscopically concavely curved upper surfaces. The total area of the lower fixed patterns 81 in the central region CA may be larger than the total area of the lower fixed patterns 81 in the peripheral region PA. For example, the density of the lower fixed patterns 81 in the central region CA may be higher than the density of the lower fixed patterns 81 in the peripheral region PA. Viewed from a top view, the lower fixed patterns 81 may have a line shape or a web shape.

The peripheral fixed patterns 85 may be disposed in the peripheral region PA or the edge region EA. The peripheral fixed patterns 85 may vertically penetrate the image sensing chip 70 and the supporting patterns 35. The peripheral fixed patterns 85 may directly contact inner surfaces of the image sensing chip 70, the sidewalls of the supporting patterns 35, and the upper surface of the lower substrate 20. In a top view, the peripheral fixed patterns 85 may have a circle, a polygon, a bar, a line, a cross, a frame, or other geometric shapes. In an embodiment of the inventive concepts, the peripheral fixed patterns 85 may have a line shape extended in a column direction or a row direction on a top view. The peripheral fixed patterns 85 may have a pillar shape or a wall shape in a cross-sectional view. A portion of the upper surfaces of the peripheral fixed patterns 85 or the whole upper surfaces of the peripheral fixed patterns 85 may be sloped.

Each of the lower fixed patterns 81 and the peripheral fixed patterns 85 may include an underfill material or an adhesive epoxy-based insulation material. Each of the lower fixed patterns 81 and the peripheral fixed patterns 85 may include a thermosetting material having adhesiveness.

The image sensing chip 70 may include a silicon substrate, photodiodes and junction regions in the silicon substrate, transistors on the silicon substrate, metal lines, and multiple inter-layer dielectric layers. The color filters 75 and the micro-lenses 76 may be vertically aligned with the photodiodes. The lower surface of the image sensing chip 70 may be convexly curved downwards along profiles of macroscopic upper surfaces of the supporting patterns 35 and the lower fixed patterns 81. The upper surface of the image sensing chip 70 may be concavely curved along the profiles of the macroscopic upper surfaces of the supporting patterns 35 and the lower fixed patterns 81. The color filters 75 and the micro-lenses 76 may be disposed on the concavely curved upper surface.

Figure 2B:
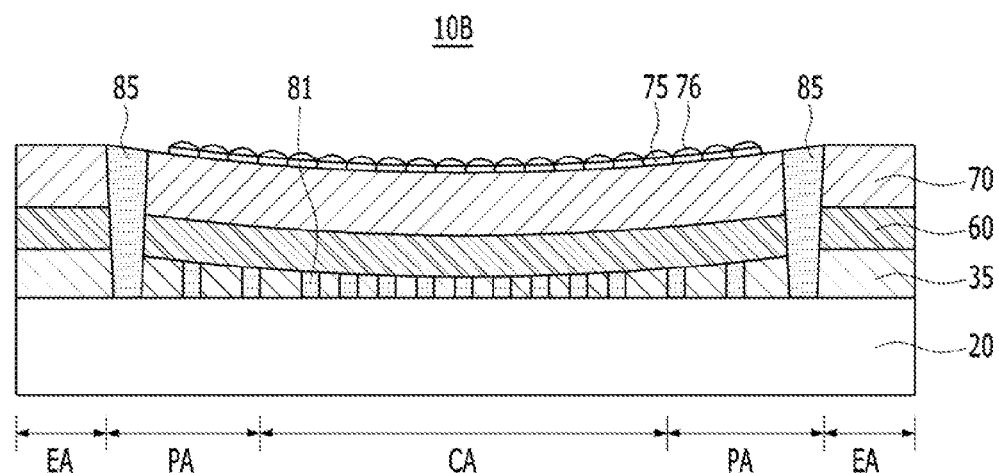

Referring to FIG. 2B, a wafer level curved image sensor 10B in accordance with an embodiment of the inventive concepts may further include a buffer layer 60 in comparison with the wafer level curved image sensor 10A described above with reference to FIG. 2A. The buffer layer 60 may be interposed between the supporting patterns 35 and the image sensing chip 70, and between the lower fixed patterns 81 and the image sensing chip 70. The buffer layer 60 may have a concave upper surface in the central region CA and the peripheral region PA. A lower surface of the buffer layer 60 may be convexly curved downwards along the profiles of the upper surfaces of the supporting patterns 35 and the lower fixed patterns 81, and the upper surface of the buffer layer 60 may be concavely curved along the profiles of the lower surface of the image sensing chip 70.

In the edge region EA, the buffer layer 60 may be a planar along the profile of the upper surface of the supporting patterns 35. The buffer layer 60 may contact the upper surfaces of the lower fixed patterns 81 and the sidewalls of the peripheral fixed patterns 85. The peripheral fixed patterns 85 may vertically penetrate the image sensing chip 70, the buffer layer 60 and the supporting patterns 35 in the peripheral region PA or the edge region EA. The buffer layer 60 may include the same material as the supporting patterns 35. For example, the buffer layer 60 may include silicon oxide, silicon nitride, silicon oxynitride, polysilicon, or a combination thereof.

Figure 2C:
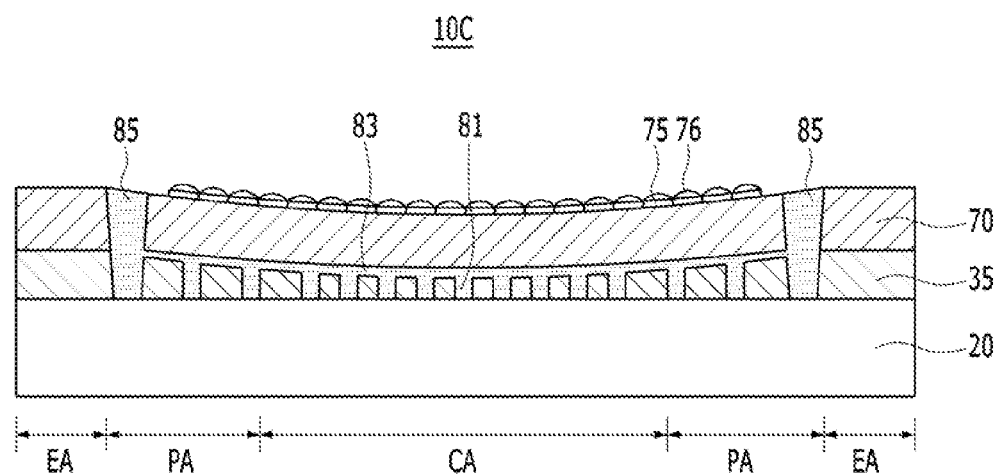

Referring to FIG. 2C, a wafer level curved image sensor 10C in accordance with an embodiment of the inventive concepts may further include upper fixed patterns 83 covering the upper surfaces of the supporting patterns 35 and the upper surfaces of the lower fixed patterns 81 in the central region CA and the peripheral region PA in comparison with the wafer level curved image sensor 10A described above with reference to FIG. 2A. For example, the upper fixed patterns 83 may be interposed between the upper surfaces of the supporting patterns 35 and the lower fixed patterns 81 and the lower surface of the image sensing chip 70 in the central region CA and the peripheral region PA. The upper fixed patterns 83 may include the same material as the lower fixed patterns 81 so as to be physically continuous to each other.

Figure 2D:
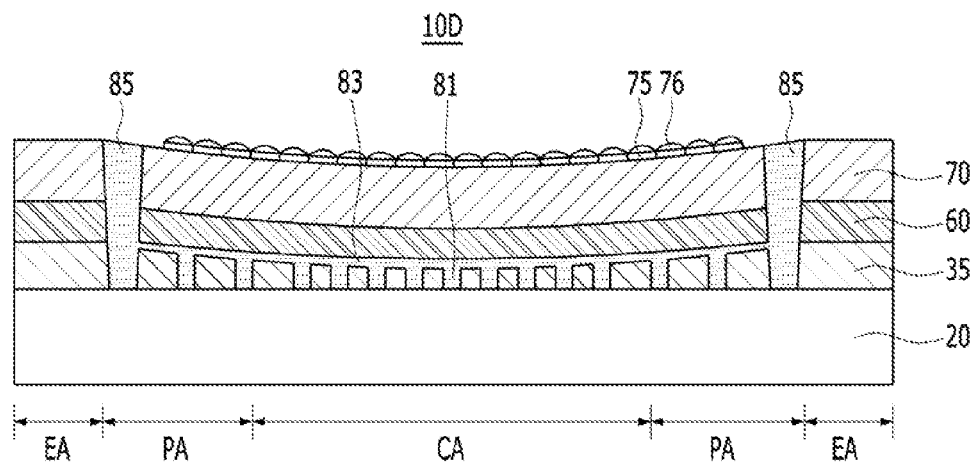

Referring to FIG. 2D, a wafer level curved image sensor 10D in accordance with an embodiment of the inventive concepts may further include upper fixed patterns 83 covering the upper surfaces of the supporting patterns 35 and the upper surfaces of the lower fixed patterns 81 in the central region CA and the peripheral region PA in comparison with the wafer level curved image sensor 10B described above with reference to FIG. 2B. For example, the upper fixed patterns 83 may be interposed between the upper surfaces of the supporting patterns 35 and the lower fixed patterns 81 and the lower surface of the buffer layer 60 in the central region CA and the peripheral region PA.

Figure 2E:
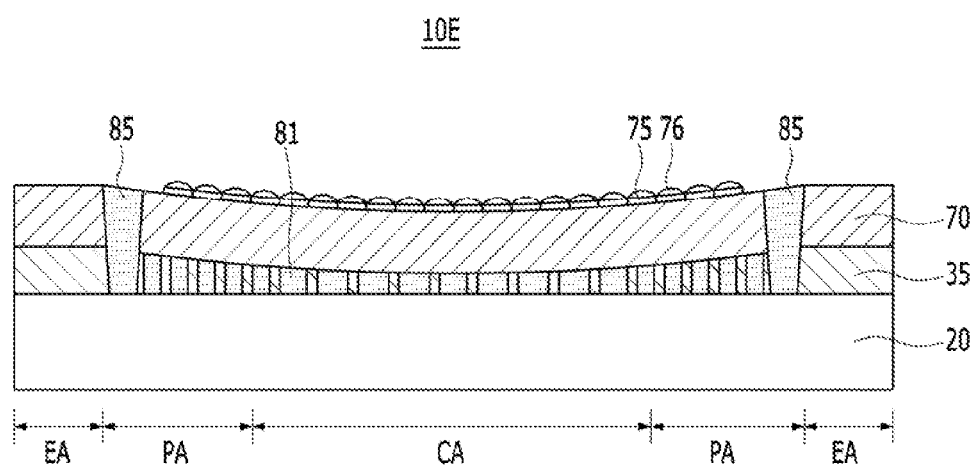

Referring to FIG. 2E, a curvature radius of the image sensing chip 70 of a wafer level curved image sensor 10E in accordance with an embodiment of the inventive concepts may decrease as pattern density of the supporting patterns 35 disposed in the central region CA gets lower in comparison with a curvature radius of the image sensing chip 70 of the wafer level curved image sensor 10A described above with reference to FIG. 2A. Specifically, the pattern density of the supporting patterns 35 may be much lower in the central region CA. Hence, a dishing phenomenon may occur and consequently, the upper and lower surfaces of the supporting patterns 35, the lower fixed patterns 81 and the image sensing chip 70 may be more concavely curved. According to an inventive concept the curvature of the upper surface of the image sensing chip 70 may be adjusted as the pattern density of the supporting patterns 35 is adjusted. The inventive concept applied to the wafer level curved image sensor 10E shown in FIG. 2E may also be applied to wafer level curved, image sensors 10B to 10D described with reference to FIGS. 2B to 2D.

Figure 2F:
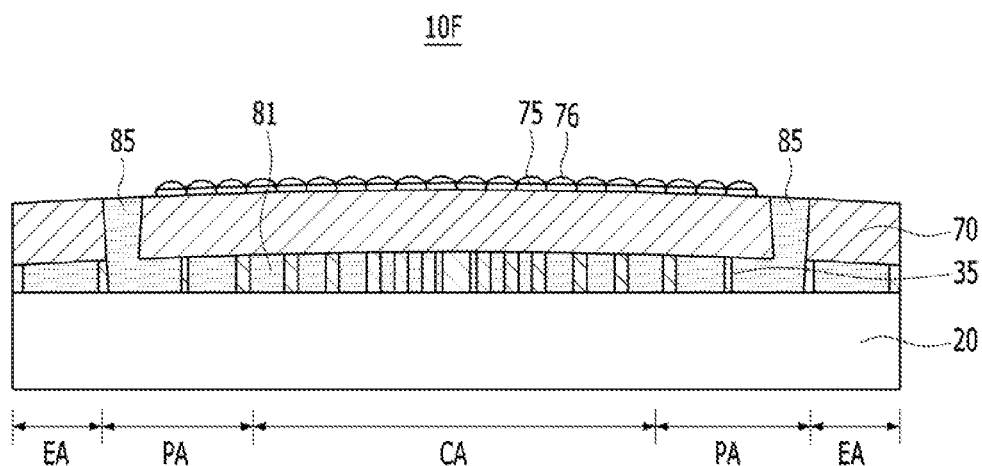

Referring to FIG. 2F, a wafer level curved image sensor 10F in accordance with an embodiment of the inventive concepts may include the supporting patterns 35, the lower fixed patterns 81, and the image sensing chip 70 which have a convexly curved central part in comparison with the wafer level curved image sensors 10A to 10E described above with reference to FIGS. 2A to 2E. Specifically, the supporting patterns 35, the lower fixed patterns 81 and the image sensing chip 70 may have convexly curved central surfaces based on the pattern density of the supporting patterns 35, which is high in the central region CA and low in the peripheral region PA and/or the edge region EA.

According to an inventive concept, the image sensing chip 70 may be curved concavely or convexly based on the pattern density of the supporting patterns 35. The inventive concept applied to the wafer level curved image sensor 10F shown in FIG. 2F may be also applied to the wafer level curved image sensors 10A to 10E described with reference to FIGS. 2A to 2E.

Figure 3A:
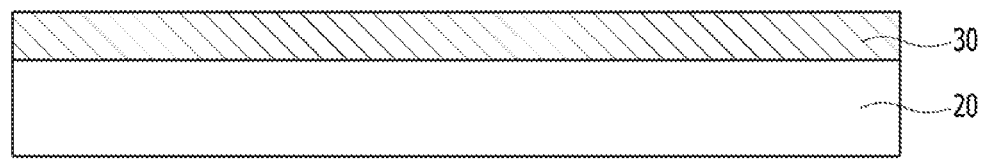
FIGS. 3A to 3J are cross-sectional views illustrating a method for fabricating a wafer level curved image sensor in accordance with an embodiment of the inventive concepts.

FIGS. 3A to 33 are cross-sectional views illustrating a method for fabricating a wafer level curved image sensor in accordance with an embodiment of the inventive concepts. Referring to FIG. 3A, the method for fabricating the wafer level curved image sensor in accordance with an embodiment of the inventive concepts may include forming a supporting layer 30 on a lower substrate 20 by performing a deposition process such as a chemical vapor deposition (CVD) process. The lower substrate 20 may include a silicon wafer. The supporting layer 30 may include a material having an etch selectivity against the lower substrate 20, for example, such as a silicon oxide.

Figure 3B:
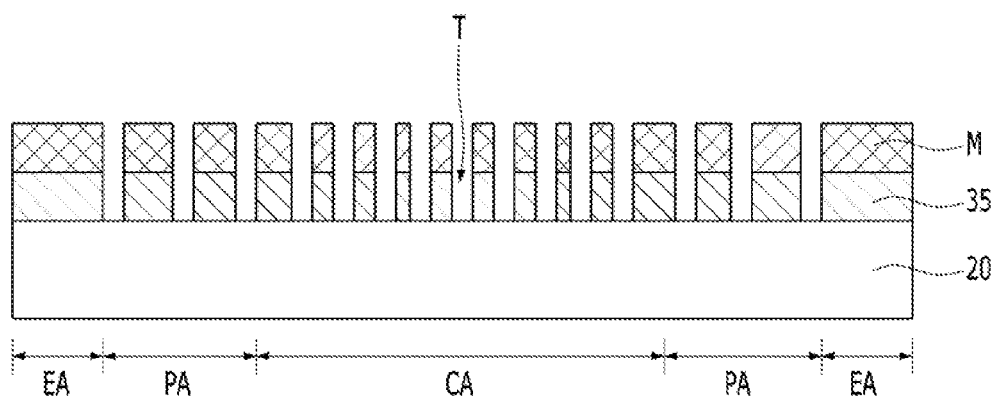

Referring to FIG. 3B, the method may include forming a plurality of supporting patterns 35 by patterning the supporting layer 30. The supporting patterns 35 may be defined by trenches T. The patterning of the supporting layer 30 may include forming a mask pattern M on the supporting layer 30 and selectively removing the supporting layer 30 by performing a dry or a wet etch process using the mask pattern M as an etch mask.

The total area occupied by the supporting patterns 35 in the central region CA may be smaller than the total area occupied by the supporting patterns 35 in the peripheral region PA. In contrast, the total area occupied by the trenches T in the central region CA may be larger than the total area occupied by the trenches T in the peripheral region PA. That is, the pattern density of the supporting patterns 35 in the central region CA may be low, and the pattern density of the supporting patterns 35 in the peripheral region PA may be high. The pattern density may indicate the total area occupied by the supporting patterns 35. The trenches T may not be formed in an exterior region of the peripheral region PA, that is, in the edge region EA. The supporting layer 30 may not be patterned in the edge region EA. Furthermore, the supporting patterns 35 may completely cover the edge region EA. The trenches T may be spatially coupled to each other. In some embodiments of the inventive concepts, each of the trenches T may have a hole shape. Subsequently, the mask pattern M may be removed.

Figure 3C:
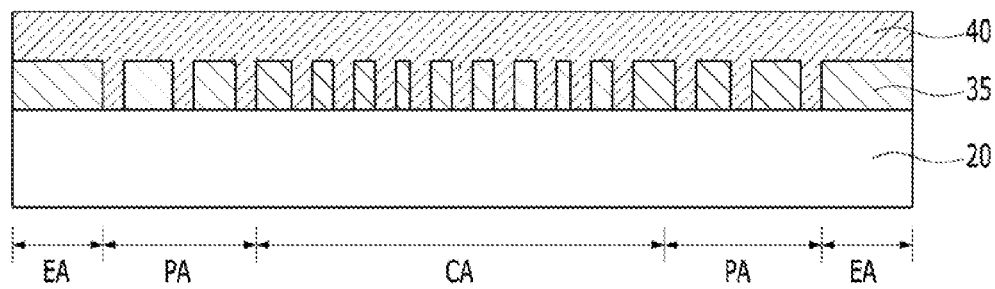

Referring to FIG. 3C, the method may include forming a sacrificial layer 40 on the supporting patterns 35 to completely fill the trenches T. The sacrificial layer 40 may have a wet etch selectivity against the supporting patterns 35 and the lower substrate 20. For example, the sacrificial layer 40 may include a silicon nitride $Si_xN_y$, where x and y are integers.

Figure 3D:
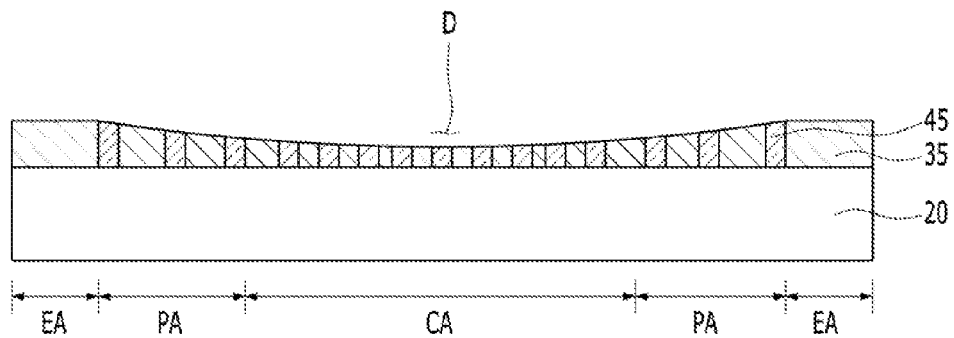

Referring to FIG. 3D, the method may include forming sacrificial patterns 45 between the supporting patterns 35 by removing an upper portion of the sacrificial layer 40 through a chemical mechanical polishing (CMP) process. In the forming of the sacrificial patterns 45, a dishing phenomenon may occur due to a difference in the pattern density of the supporting patterns 35 depending on locations. Since the pattern density of the supporting patterns 35 in the central region CA is lower than the pattern density of the supporting patterns 35 in the peripheral region PA, a dishing region D where the central region CA is concavely over-polished may be formed in the central region CA. Otherwise, since the pattern density of the sacrificial patterns 45 in the central region CA is higher than the pattern density of the sacrificial patterns 45 in the peripheral region PA, a dishing region D where the central region CA is concavely over-polished may be formed. A weak dishing phenomenon may occur in the peripheral region PA. The upper surfaces of the supporting patterns 35 in the edge region EA where the trenches T or the sacrificial patterns 45 do not exist may be substantially planar.

Figure 3E:
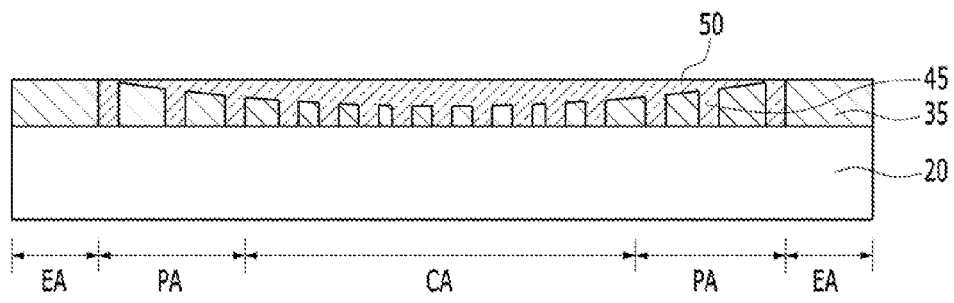

Referring to FIG. 3E, the method may include forming a planarization layer 50 in the dishing region D to cover the supporting patterns 35 and the sacrificial patterns 45 in the central region CA and the peripheral region PA. The planarization layer 50 may include the same material as the sacrificial patterns 45. The planarization layer 50 may include a material that is simultaneously removed with the sacrificial patterns 45 through a wet etch process. The upper surfaces of the supporting patterns 35 disposed in the edge region EA may not be covered with the planarization layer 50 and may be exposed.

Figure 3F:
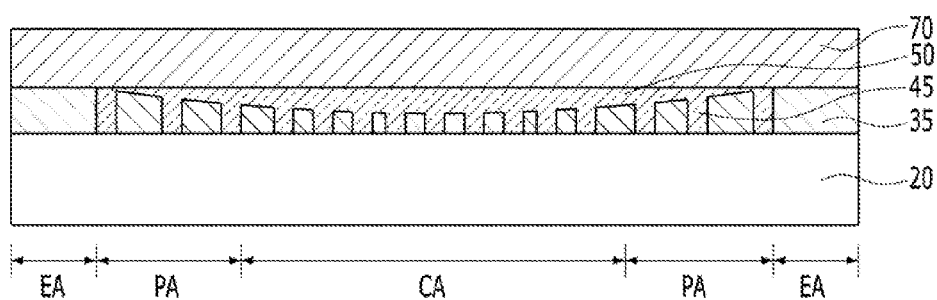

Referring to FIG. 3F, the method may include stacking the image sensing chip 70 on the planarization layer 50 and the supporting patterns 35 in the edge region EA. The image sensing chip 70 may include a photodiode, pixel transistors, and lines.

Figure 3G:
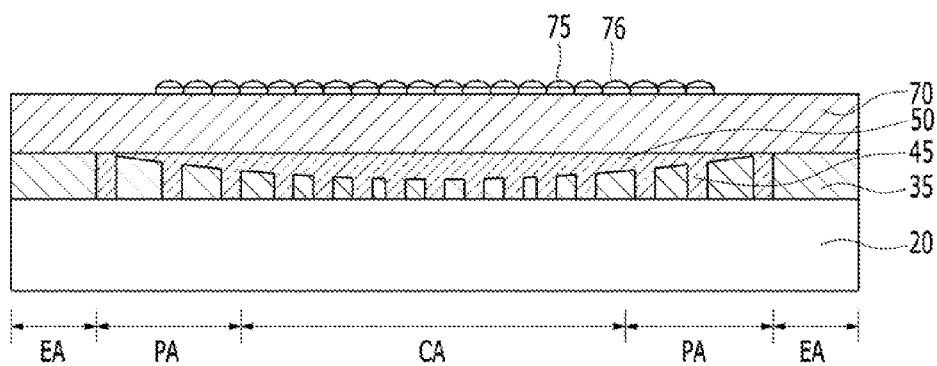

Referring to FIG. 3G, the method may include forming color filters 75 and micro-lenses 76 on the image sensing chip 70. In another embodiment of the inventive concepts, the color filters 75 and the micro-lenses 76 may already be formed on the image sensing chip 70. That is, the image sensing chip 70 may include the color filters 75 and the micro-lenses 76 formed on the upper surface of the image sensing chip 70.

Figure 3H:
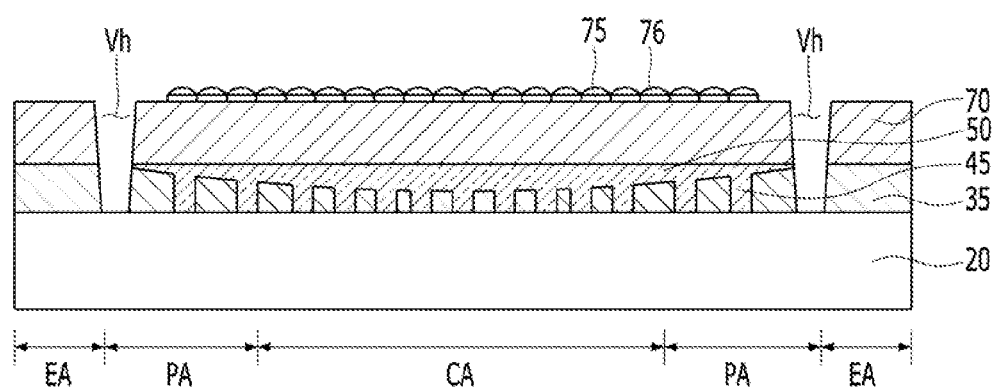

Referring to FIG. 3H, the method may include forming vacuum holes Vh exposing a surface of the lower substrate 20 by penetrating the image sensing chip 70, the planarization layer 50, the sacrificial patterns 45 and the supporting patterns 35. The vacuum holes Vh may be formed in the peripheral region PA of the image sensing chip 70. The vacuum holes Vh may have a slit shape or a trench shape when viewed from the top.

Figure 3I:
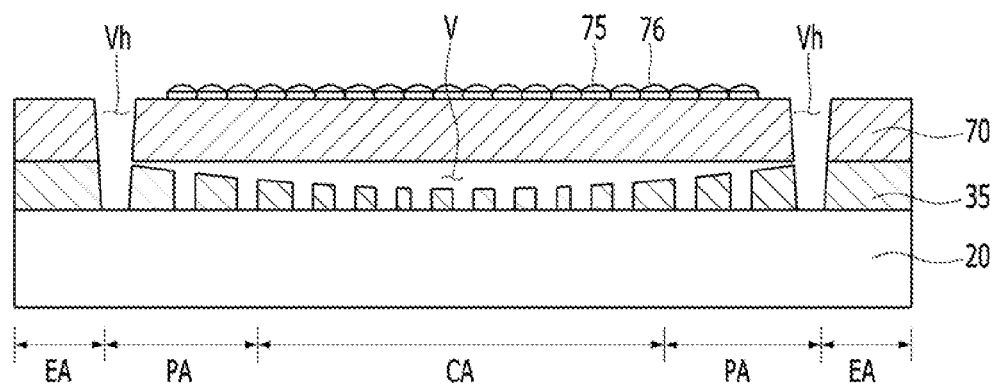

Referring to FIG. 3I, the method may include removing the planarization layer 50 and the sacrificial patterns 45 through the vacuum holes Vh. The planarization layer 50 and the sacrificial layer 40 may be removed through the wet etch process. For example, the wet etch process may use an etchant including diluted hydrofluoric acid (HF). Voids V may be formed in spaces where the planarization layer 50 and the sacrificial layer 40 are removed. The vacuum holes Vh and the voids V may be spatially coupled to each other.

Figure 3J:
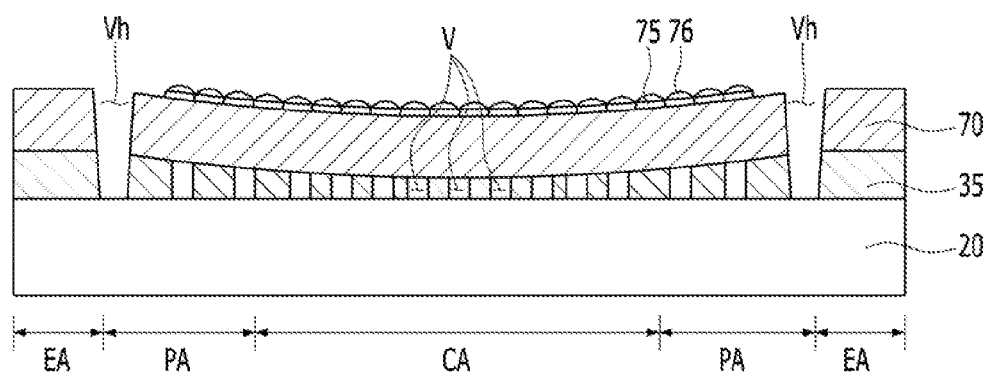

Referring to FIG. 3J, the method may include concavely bending the image sensing chip 70 by vacuum-emitting air in the voids V and the vacuum holes Vh through the vacuum holes Vh. In the bending of the image sensing chip 70, the upper surfaces of the supporting patterns 35 and the lower surface of the image sensing chip 70 may contact each other. The voids V may remain between the supporting patterns 35.

Subsequently, referring to FIG. 2A, the method may include forming lower fixed patterns 81 and peripheral fixed patterns 85 by filling the voids V and the vacuum holes Vh with an adhesive and hardening material through the vacuum holes Vh. The adhesive and hardening material may include an underfill material, an epoxy-based adhesive and hardening material or thermosetting high molecule organic material. The method may further include performing a hardening process for hardening the adhesive and hardening material. The hardening process may include a room-temperature drying process or an annealing process.

Figure 4A:
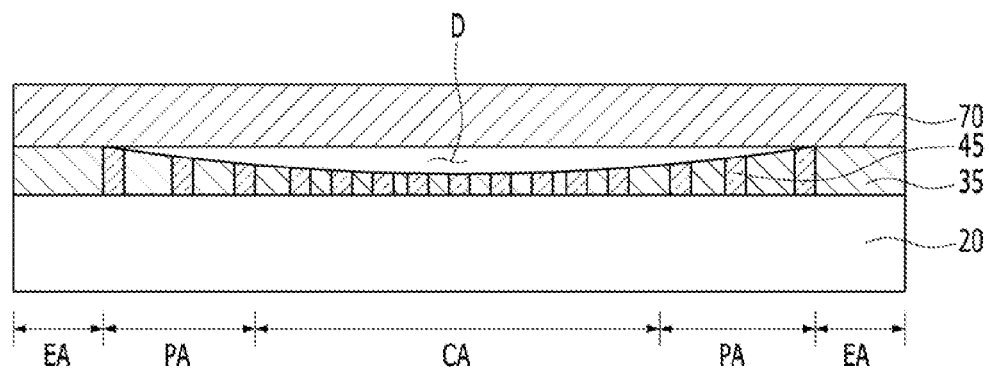
FIGS. 4A to 4C are cross-sectional views illustrating a method for fabricating a wafer level curved image sensor in accordance with another embodiment of the inventive concepts.
Figure 4B:
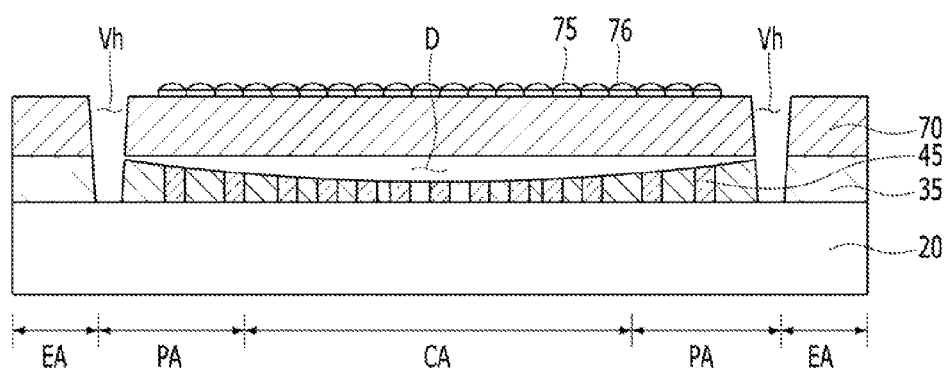
Figure 4C:
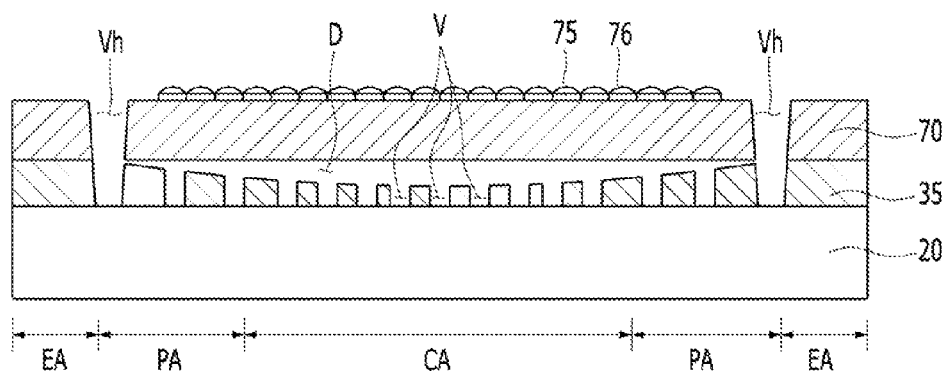

FIGS. 4A to 4C are cross-sectional views illustrating a method for fabricating a wafer level curved image sensor in accordance with another embodiment of the inventive concepts. Referring to FIG. 4A, a method for fabricating a wafer level curved image sensor in accordance with another embodiment of the inventive concepts may include forming a supporting layer 30 on a lower substrate 20, forming supporting patterns 35 and trenches T by patterning the supporting layer 30, forming a sacrificial layer 40 on the supporting patterns 35 to completely fill the trenches T, forming sacrificial patterns 45 and a dishing region D by removing an upper portion of the sacrificial layer 40 through a chemical mechanical polishing (CMP) process, and stacking an image sensing chip 70 on the supporting patterns 35 and the sacrificial patterns 45, through the aforementioned fabrication processes with reference to FIGS. 3A to 3D.

For example, a planarization layer 50 in the dishing region D, which is described above with reference to FIG. 3E, may be omitted. Accordingly, a lower surface of the image sensing chip 70 may contact upper surfaces of the supporting patterns 35 in the edge region EA. The dishing region D in the central region CA and the peripheral region PA may remain.

Referring to FIG. 4B, the method may include forming color filters 75 and macro-lenses 76 on the image sensing chip 70, and forming vacuum holes Vh exposing a surface of the lower substrate 20 by penetrating the image sensing chip 70, the planarization layer 50, the sacrificial layer 40 and the supporting patterns 35, through the aforementioned fabrication processes with reference to FIGS. 3G and 3H. The vacuum holes Vh and the dishing region D may be spatially coupled to each other.

Referring to FIG. 4C, the method may include removing the sacrificial patterns 45 through the vacuum holes Vh by performing the aforementioned fabrication processes with reference to FIG. 3I. Voids V caused by removing the vacuum holes Vh, the dishing region D and the sacrificial patterns 45 may be spatially coupled to each other. Subsequently, the method may include concavely bending the image sensing chip 70 by vacuum-emitting air of the voids V and the vacuum holes Vh through the vacuum holes Vh by performing the aforementioned fabrication processes with reference to FIG. 3J.

Subsequently, referring to FIG. 2C, the method may include forming lower fixed patterns 81, the upper fixed patterns 83, and peripheral fixed patterns 85 by filling the voids V and the vacuum holes Vh with an adhesive and hardening material through the vacuum holes Vh. The adhesive and hardening material may include an underfill material, an epoxy-based adhesive and hardening material or thermosetting high molecule organic material. The method may further include performing a hardening process for hardening the adhesive and hardening material. The hardening process may include a room-temperature drying process or an annealing process.

Figure 5A:
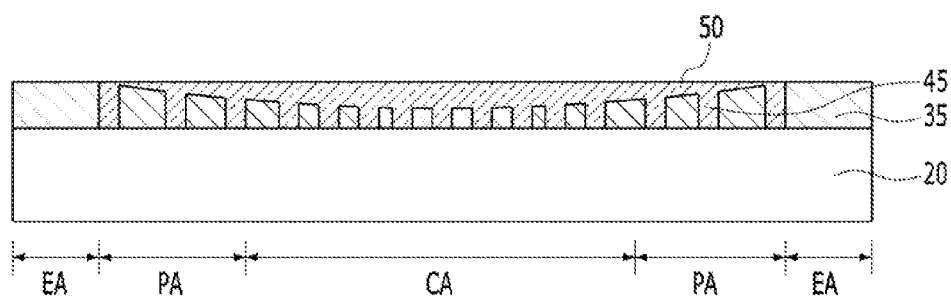
FIGS. 5A to 5F are cross-sectional views illustrating a method for fabricating a wafer level curved image sensor in accordance with yet another embodiment of the inventive concepts.

FIGS. 5A to 5F are cross-sectional views illustrating a method for fabricating a wafer level curved image sensor in accordance with yet another embodiment of the inventive concepts. Referring to FIG. 5A, a method for fabricating a wafer level curved image sensor in accordance with an embodiment of the inventive concepts may include forming a supporting layer 30 on a lower substrate 20, forming supporting patterns 35 and trenches T by patterning the supporting layer 30, forming a sacrificial layer 40 on the supporting patterns 35 to completely fill the trenches T, forming sacrificial patterns 45 and a dishing region D by removing an upper portion of the sacrificial layer 40 through a chemical mechanical polishing (CMP) process, and forming a planarization layer 50 on the supporting patterns 35 and the sacrificial patterns 45 of the central region CA and the peripheral region PA, through the aforementioned fabrication processes with reference to FIGS. 3A to 3E.

Figure 5B:
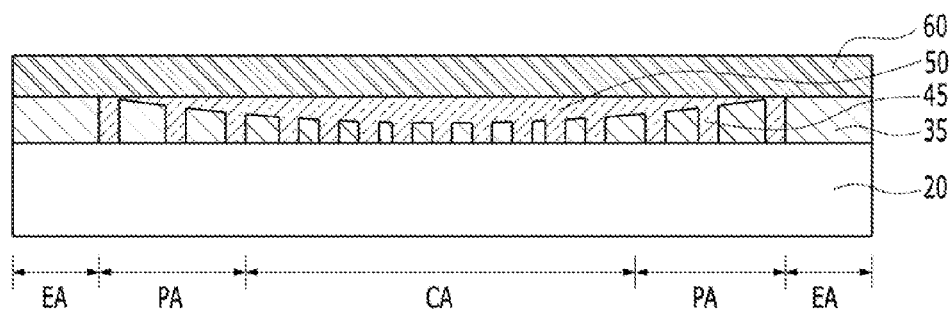

Referring to FIG. 5B, the method may include forming a buffer layer 60 on the planarization layer 50 and the supporting patterns 35 of the edge region EA. The buffer layer 60 may include a material having a wet etch selectivity against the planarization layer 50 and the sacrificial patterns 45. For example, the buffer layer 60 may include silicon oxide.

Figure 5C:
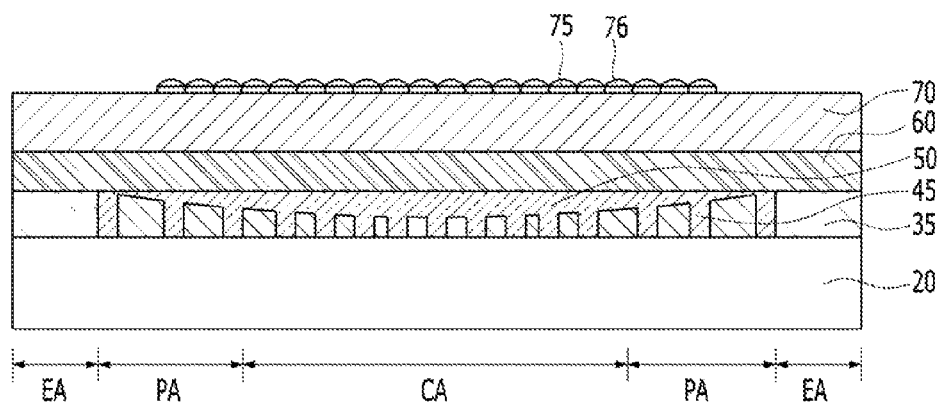

Referring to FIG. 5C, the method may include stacking an image sensing chip 70 on the buffer layer 60 and forming color filters 75 and micro-lenses 76 on the image sensing chip 70, through the aforementioned fabrication processes with reference to FIGS. 3F and 3G.

Figure 5D:
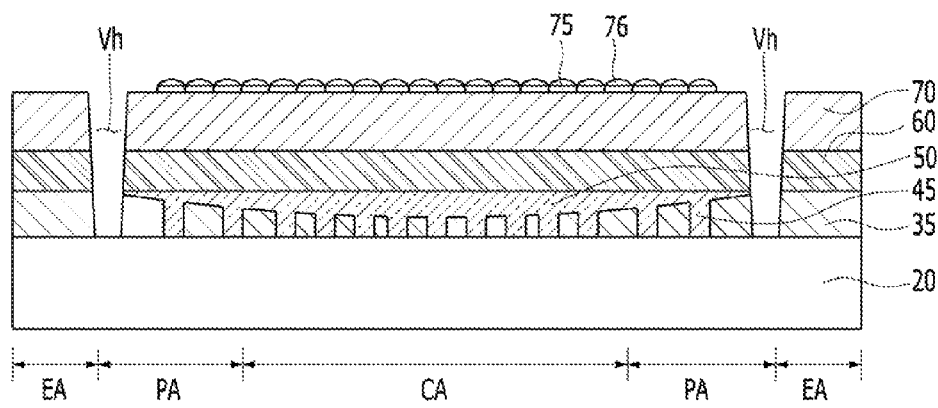

Referring to FIG. 5D, the method may include forming vacuum holes Vh exposing a surface of the lower substrate 20 by penetrating the image sensing chip 70, the buffer layer 60, the planarization layer 50, the sacrificial patterns 45 and the supporting patterns 35 through the aforementioned fabrication processes with reference to FIG. 3H.

Figure 5E:
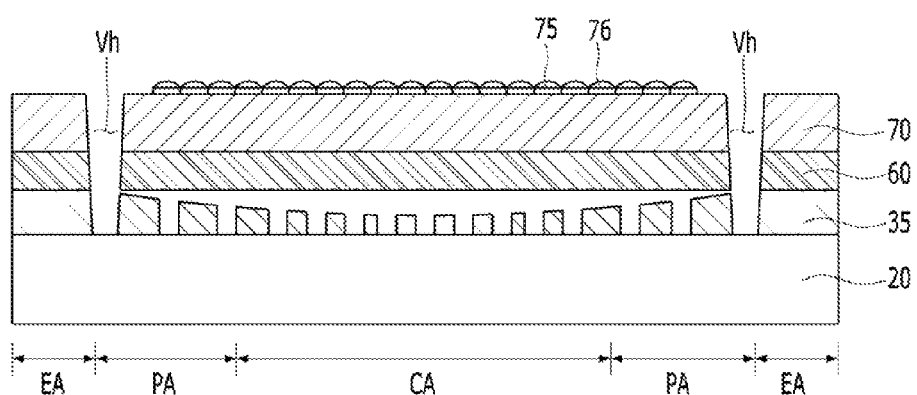

Referring to FIG. 5E, the method may include removing the planarization layer 50 and the sacrificial patterns 45 through the vacuum holes Vh by performing the aforementioned fabrication processes with reference to FIG. 3I. The buffer layer 60 may not be removed but remain. A dishing region D and voids V may exist as an empty space, that is, an air space.

Figure 5F:
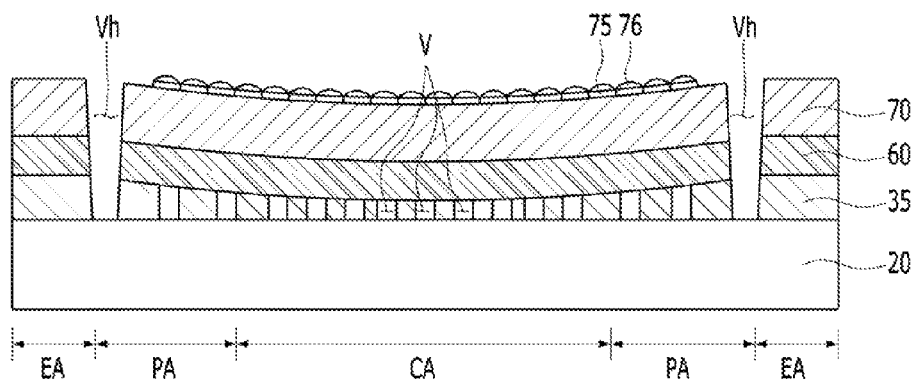

Referring to FIG. 5F, the method may include concavely bending the image sensing chip 70 by vacuum-emitting air of the dishing region D, the voids V and the vacuum holes Vh through the vacuum holes Vh by performing the aforementioned fabrication processes with reference to FIG. 3J. In this fabrication process, as a lower surface of the buffer layer 60 contacts upper surfaces of the supporting patterns 45 in the central region CA and the peripheral region PA, the dishing region D may disappear.

Subsequently, referring to FIG. 2B, the method may include forming lower fixed patterns 81 and peripheral fixed patterns 85 by filling the voids V and the vacuum holes Vh with an adhesive and hardening material through the vacuum holes Vh.

Figure 6A:
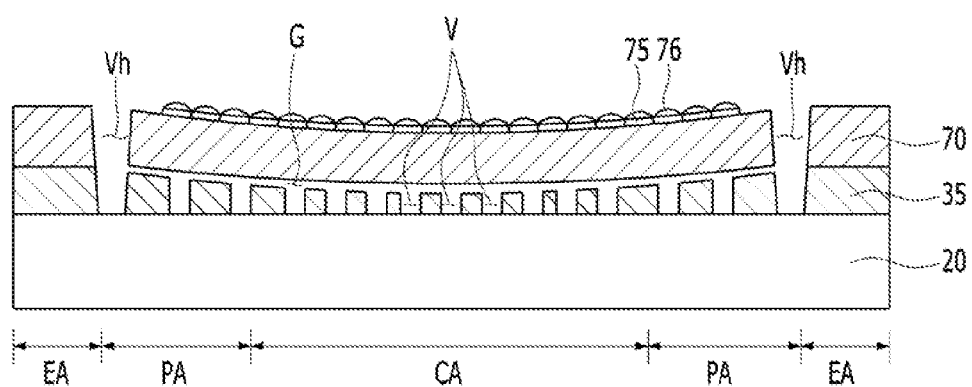
FIGS. 6A and 6B are cross-sectional views illustrating a method for fabricating a wafer level curved image sensor in accordance with yet another embodiment of the inventive concepts.
Figure 6B:
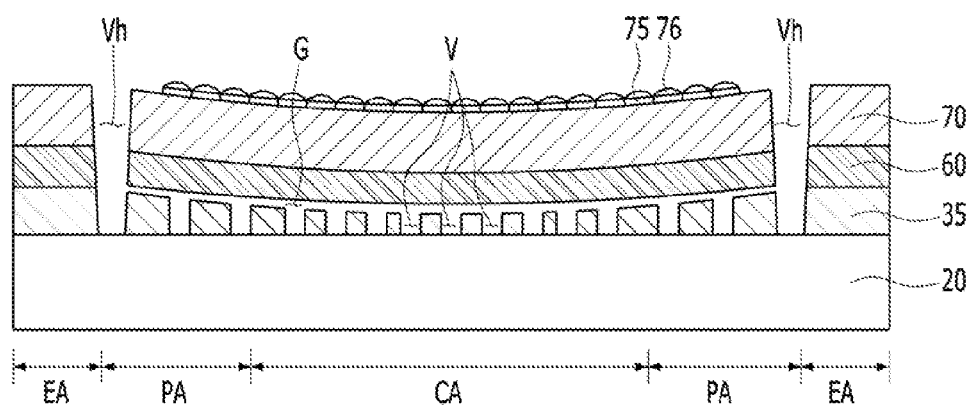

FIGS. 6A and 6B are cross-sectional views illustrating a method for fabricating a wafer level curved image sensor in accordance with yet another embodiment of the inventive concepts. Referring to FIG. 6A, a method for fabricating a wafer level curved image sensor in accordance with an embodiment of the inventive concepts may include forming an air gap G between upper surfaces of supporting patterns 35 and a lower surface of an image sensing chip 70 in the central region CA and the peripheral region PA under the aforementioned fabrication processes with reference to FIGS. 3A to 3J. Specifically, the upper surfaces of the supporting patterns 35 may not contact the lower surface of the image sensing chip 70 in the central region CA and the peripheral region PA. Subsequently, referring to FIG. 2C, the method may include filling the air gap G, voids V and vacuum holes Vh with an adhesive and hardening material.

Referring to FIG. 6B, a method for fabricating a wafer level curved image sensor in accordance with yet another embodiment of the inventive concepts may include forming an air gap G between the upper surfaces of the supporting patterns 35 and a lower surface of the buffer layer 60 in the central region CA and the peripheral region PA under the aforementioned fabrication processes with reference to FIGS. 5A to 5F. Specifically, the upper surfaces of the supporting patterns 35 may not contact the lower surface of the buffer layer 60 in the central region CA and the peripheral region PA. Subsequently, referring to FIG. 2D, the method may include filling the air gap G, voids V and vacuum holes Vh with an adhesive and hardening material.

Figure 7:
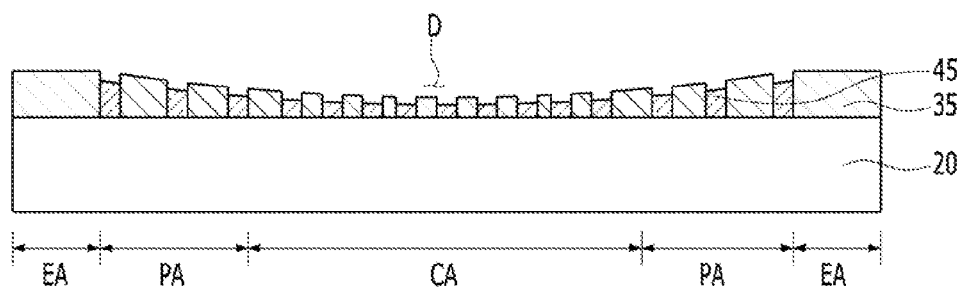
FIG. 7 is a cross-sectional view illustrating a wafer level curved image sensor with recessed sacrificial patterns in accordance with various embodiments of the inventive concepts.

FIG. 7 is a cross-sectional view illustrating an embodiment in which upper surfaces of sacrificial patterns may be recessed lower than upper surfaces of supporting patterns in methods for fabricating a wafer level curved image sensor. For example, under the fabrication process described with reference to FIG. 3D, the upper surfaces of the sacrificial patterns 45 may be over-removed lower than the upper surfaces of the supporting patterns 35 in a dishing region D when a CMP process is over-performed.

Figure 8:
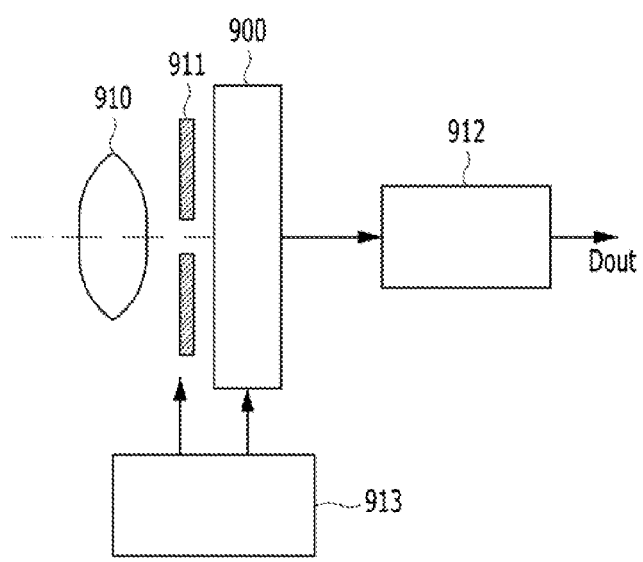
FIG. 8 is a block diagram illustrating an electronic device including a wafer level curved image sensor in accordance with an embodiment of the inventive concepts.

FIG. 8 is a block diagram illustrating an electronic device including a wafer level curved image sensor in accordance with the embodiments of the inventive concepts. Referring to FIG. 8, an electronic device including at least one of the wafer level curved image sensors 10A to 10F in accordance with various embodiments of the inventive concepts may include a camera capable of filming static images or moving images. The electronic device may include an optical system 910 or an optical lens, a shutter unit 911, a driving block 913 for controlling and driving an image sensor 900 and the shutter unit 911, and a signal processing block 912.

The optical system 910 may lead image light, that is, incident light, from a subject to a pixel array (refer to numeral '3' of FIG. 1) of the image sensor 900. The optical system 910 may be formed of a plurality of optical lenses. The shutter unit 911 may control a light irradiation period and a shielding period for the image sensor 900. The driving block 913 may control a transmission operation of the image sensor 900 and a shutter operation of the shutter unit 911. The signal processing block 912 may perform various kinds of signal processes on a signal outputted from the image sensor 900. An image signal Dout after the signal processes are performed may be stored in storage media such as a memory or outputted to a monitor, etc.

In accordance with the embodiments of the inventive concepts, since a wafer level curved image sensor has a concavely curved upper surface, aberration of a camera lens may be corrected, and a light-receiving amount of pixels may be uniform. Accordingly, a distortion in an image can be reduced.

In accordance with the embodiments of the inventive concepts, since a wafer level curved image sensor is fabricated in the course of processing a wafer, the wafer level curved image sensor can be easily fabricated. In accordance with the embodiments of the inventive concepts, a wafer level curved image sensor can be fabricated in a small size and applied to various products.

While the inventive concepts have been described with respect to specific embodiments, the embodiments are not intended to be restrictive, but rather descriptive. Further, it is noted that the inventive concepts may be achieved in various ways through substitution, change, and modification, by those skilled in the art without departing from the spirit and/or scope of the inventive concepts as defined by the following claims.

What is claimed is:

1. A wafer level curved image sensor, comprising:
supporting patterns formed over a substrate;
first fixed patterns formed between the supporting patterns; and
an image sensing chip formed over the supporting patterns,
wherein the supporting patterns and the first fixed patterns, in combination, form a planar lower surface and a concavely-curved upper surface,
wherein the image sensing chip has a curved lower surface and a curved upper surface, and
wherein a pattern density of the supporting patterns in a central region of the substrate is lower than a pattern density of the supporting patterns in a peripheral region of the substrate.

2. The wafer level curved image sensor of claim 1, further comprising:
peripheral fixed patterns,
wherein the substrate includes the central region, an edge region, and the peripheral region formed between the central region and the edge region, and
wherein the peripheral fixed patterns are formed in the peripheral region and extending through the image sensing chip and the supporting patterns to contact the substrate.

3. The wafer level curved image sensor of claim 2,
wherein the central region, the peripheral region, and the edge region are disposed in a chip area of the image sensing chip.

4. The wafer level curved image sensor of claim 2, further comprising:
second fixed patterns formed in the central region and the peripheral region, covering the upper surfaces of the supporting patterns and upper surfaces of the first fixed patterns, and contacting the planar lower surface of the image sensing chip.

5. The wafer level curved image sensor of claim 4, wherein the first fixed patterns and the second fixed patterns are formed of the same material as each other and coupled to each other.

6. The wafer level curved image sensor of claim 1, further comprising:
a buffer layer provided between the supporting patterns and the image sensing chip and between the first fixed patterns and the image sensing chip.

7. The wafer level curved image sensor of claim 6, wherein the buffer layer comprises the same material as the supporting patterns.

8. The wafer level curved image sensor of claim 1, wherein a total area occupied by the first fixed patterns in the central region is greater than a total area occupied by the supporting patterns in the peripheral region.

9. The wafer level curved image sensor of claim 1, wherein the first fixed patterns are not disposed in the edge region.

10. The wafer level curved image sensor of claim 1, wherein the supporting patterns and the lower fixed patterns are arranged side by side in an alternative manner.

11. A wafer level curved image sensor, comprising:
a substrate having a planar upper surface;
supporting patterns formed over the planar upper surface of the substrate;
lower fixed patterns formed between the supporting patterns;
an image sensing chip formed over the supporting patterns and the lower fixed patterns; and
peripheral fixed patterns vertically extending through the image sensing chip and the supporting patterns to contact the planar upper surface of the substrate,
wherein the supporting patterns and the lower fixed patterns, in combination, form a planar lower surface and a concavely-curved upper surface.

12. The wafer level curved image sensor of claim 11, wherein a lower surface and an upper surface of the image sensing chip are curved along a profile of the concavely-curved upper surface formed by the supporting patterns and the lower fixed patterns.

13. The wafer level curved image sensor of claim 11, further comprising:
a buffer layer provided between the supporting patterns and the image sensing chip and between the lower fixed patterns and the image sensing chip,
wherein a lower surface and an upper surface of the buffer layer are curved along a profile of the concavely-curved upper surface formed by the supporting patterns and the lower fixed patterns.

14. The wafer level curved image sensor of claim 11, further comprising:
upper fixed patterns provided between the supporting patterns and the image sensing chip and between the lower fixed patterns and the image sensing chip,
wherein lower surfaces and upper surfaces of the upper fixed patterns are curved along a profile of the concavely-curved upper surface formed by the supporting patterns and the lower fixed patterns.

15. The wafer level curved image sensor of claim 11, wherein each of the lower fixed patterns and the peripheral fixed patterns includes an adhesive, a hardening material, or a combination thereof.

16. A wafer level curved image sensor, comprising:
a lower substrate having a central region, a peripheral region surrounding the central region, and an edge region surrounding the peripheral region;
supporting patterns formed over the lower substrate;
lower fixed patterns formed between the supporting patterns;
an image sensing chip formed over the supporting patterns and the lower fixed patterns; and
peripheral fixed patterns formed in the peripheral region and vertically extending through the image sensing chip and the supporting patterns to contact the lower substrate,
wherein the supporting patterns and the lower fixed patterns, in combination, form a concavely curved upper surface in the central and peripheral regions,
wherein the image sensing chip has a concavely curved upper surface in the central and peripheral regions,
wherein the supporting patterns, in combination, form a planar upper surface in the edge region, and
wherein the image sensing chip has a planar upper surface in the edge region.

17. The wafer level curved image sensor of claim 16, wherein the supporting patterns have island shapes, and
wherein the lower fixed patterns have web shapes.

18. The wafer level curved image sensor of claim 16, wherein the peripheral fixed patterns have line shapes and extend in a vertical direction or in a horizontal direction.

19. The wafer level curved image sensor of claim 16, further comprising:
upper fixed patterns provided between the supporting patterns and the image sensing chip and between the lower fixed patterns and the image sensing chip, and formed in the central region and in the peripheral region.

\* \* \* \* \*